(12) United States Patent
Luo et al.

(10) Patent No.: US 9,369,201 B2
(45) Date of Patent: Jun. 14, 2016

(54) INTEGRATED MULTI-CHANNEL WAVELENGTH MONITOR

(75) Inventors: Ying L. Luo, San Diego, CA (US); Xuezhe Zheng, San Diego, CA (US); Ashok V. Krishnamoorthy, San Diego, CA (US); Guoliang Li, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 238 days.

(21) Appl. No.: 13/453,930

(22) Filed: Apr. 23, 2012

(65) Prior Publication Data

US 2014/0029940 A1    Jan. 30, 2014

(51) Int. Cl.
| | |
|---|---|
| *H04B 10/08* | (2006.01) |
| *H04B 10/077* | (2013.01) |
| *H04B 10/079* | (2013.01) |
| *H01S 5/0687* | (2006.01) |
| *H01S 5/40* | (2006.01) |

(52) U.S. Cl.
CPC ...... *H04B 10/0775* (2013.01); *H04B 10/07955* (2013.01); *H01S 5/0687* (2013.01); *H01S 5/40* (2013.01)

(58) Field of Classification Search
CPC .................. H04B 10/07; H04B 10/079; H04B 10/07955; H04B 10/293; H04B 10/506; H04B 10/572; H04J 14/02; G02B 6/29308; G02B 6/12004; G02B 6/12007; G02B 6/12019; G02B 6/124; G01J 3/18
See application file for complete search history.

(56) References Cited

U.S. PATENT DOCUMENTS

| | | | |
|---|---|---|---|
| 6,587,214 B1 * | 7/2003 | Munks | 356/519 |
| 2002/0191887 A1* | 12/2002 | Bidnyk | 385/15 |
| 2003/0095736 A1* | 5/2003 | Kish et al. | 385/14 |
| 2004/0264857 A1* | 12/2004 | Bernasconi | G02B 6/12016 385/37 |
| 2005/0219701 A1* | 10/2005 | Balakrishnan et al. | 359/572 |
| 2006/0164639 A1* | 7/2006 | Horn et al. | 356/326 |
| 2007/0086703 A1* | 4/2007 | Kirk et al. | 385/37 |
| 2007/0098324 A1* | 5/2007 | Kitamura et al. | 385/37 |

* cited by examiner

*Primary Examiner* — Ken N Vanderpuye
*Assistant Examiner* — David Lambert
(74) *Attorney, Agent, or Firm* — Park, Vaughan, Fleming & Dowler LLP

(57) ABSTRACT

An optical-source monitor images and diffracts received optical signals using an optical device that has a reflective geometry. For example, the optical device may include a diffraction grating on a curved surface, such as an echelle grating. By imaging and diffracting the optical signals, the optical device may couple to the optical signals on different diffraction orders of the optical device (which have different carrier wavelengths) from input optical waveguides to corresponding output optical waveguides. Then, output power monitors may measure the output power levels of the optical signals, and control logic may provide wavelength control signals to optical sources that provide the optical signals based on measured output power levels.

20 Claims, 7 Drawing Sheets

INTEGRATED MULTI-CHANNEL WAVELENGTH MONITOR

GOVERNMENT LICENSE RIGHTS

This invention was made with Government support under Agreement No. HR0011-08-9-0001 awarded by Defense Advanced Research Projects Administration. The Government has certain rights in the invention.

BACKGROUND

1. Field

The present disclosure generally relates to optical devices. More specifically, the present disclosure relates to an integrated multi-channel wavelength monitor which uses a diffractive echelle grating.

2. Related Art

High data rates are often achieved in optical telecommunication systems using wavelength-division-multiplexing (WDM) signals. WDM signals typically include light encoding data in multiple channels, each of which is at predefined channel or carrier wavelength. These carrier wavelengths are typically separated by 25 to 200 GHz within the 1528 to 1565 nm wavelength range.

An important component in WDM systems is a wavelength locker. This device stabilizes the output wavelength of a laser source (such as a laser diode), thereby ensuring that the carrier wavelengths conform to a standard (such as the International Telecommunication Union grid) and preventing channel crosstalk. This wavelength stabilization is often necessary when the channel spacing is decreased from 100 GHz to 50 GHz (or less) in order to compensate for factors that can shift laser-diode output wavelengths, such as: chip temperature variation, module-case temperature variation, bias-current changes and device aging.

As a consequence, wavelength lockers often include wavelength monitors that are used to provide feedback when locking laser sources. (In the discussion that follows, the combination of a wavelength monitor and a wavelength locker is sometimes referred to as an 'optical-source monitor.') Many commonly used wavelength monitors are based on thin-film filters and Fabry-Pérot etalons. However, these types of filter devices are usually costly, very bulky (e.g., several millimeter in size), and often require the corresponding discrete components (such as beam splitters and photo-detectors) to be placed on their own mounts, while the wavelength-monitoring devices are thermally coupled to a separate thermoelectric cooler (TEC). As shown in FIG. 1, which presents a block diagram of an existing front-facet wavelength monitor, the arrangement of the components can be very complicated, and usually requires very precise alignment between these discrete elements.

In addition, this type of wavelength monitor typically only works on a single wavelength at a time. In order to monitor multiple laser sources simultaneously, a set of wavelength monitors that work cooperatively may be needed, which can significantly increase the total package size and cost.

Hence, there is a need for an optical-source monitor that does not suffer from the above-described problems.

SUMMARY

One embodiment of the present disclosure provides an optical-source monitor that includes: input optical waveguides that convey optical signals having carrier wavelengths, where a given optical signal on a given input optical waveguide has a given carrier wavelength; an optical device; the output optical waveguides that convey the optical signals, where the given optical signal on a given output optical waveguide has the given carrier wavelength; output power monitors; and control logic. The optical device has input ports optically coupled to the input optical waveguides and output ports optically coupled to output optical waveguides. These input ports receive the optical signals, which are then imaged and diffracted in the optical device using a reflective geometry, and the output ports couple to the optical signals on different diffraction orders of the optical device to the output optical waveguides. Moreover, the output power monitors, which are optically coupled to the output optical waveguides, measure output power levels of the optical signals, where a given output power monitor may measure an output power level of the given optical signal. Furthermore, control logic, electrically coupled to the output power monitors, provides wavelength control signals to optical sources that provide the optical signals based on the measured output power levels of the optical signals.

Note that an incidence angle associated with the given diffraction order in the optical device may be different than a diffraction angle associated with the given diffraction order. The optical device may include a diffraction grating on a curved surface. For example, the optical device may include an echelle grating.

Moreover, the optical-source monitor may be implemented using silicon-on-insulator technology. For example, the optical-source monitor may include: a substrate; a buried-oxide layer disposed on the substrate; and a semiconductor layer disposed on the buried-oxide layer, where the optical device is included in the semiconductor layer.

In some embodiments, the carrier wavelengths have approximately a fixed spacing.

Furthermore, a number of input optical waveguides may equal a number of output optical waveguides, and the number of input optical waveguides may equal a number of carrier wavelengths.

Additionally, the control logic may independently and concurrently adjust the wavelength control signals based on the measured output power levels.

In some embodiments, the optical-source monitor includes: beam splitters optically coupled to the input optical waveguides; and input power monitors optically coupled to the beam splitters, where a given input power monitor measures an input power level of the given optical signal. The control logic may be electrically coupled to the input power monitors and may provide power control signals to the optical sources that provide the optical signals based on measured input power levels of the optical signals.

Another embodiment provides a system that includes the optical-source monitor.

Another embodiment provides a method for monitoring carrier wavelengths of optical signals output by optical sources, which may be performed by the optical-source monitor. During operation, the optical-source monitor receives the optical signal via the input optical waveguides, where the given optical signal on the given input optical waveguide has the given carrier wavelength. Then, the optical device having the reflective geometry images and diffracts the optical signals. Moreover, the optical device outputs the optical signals on different diffraction orders of the optical device at the output optical waveguides, where the given optical signal on the given output optical waveguide has the given carrier wavelength. Furthermore, the power monitors measure the output power levels of the optical signals, where the given output power monitor measures the output power level of the given optical signal. Next, the optical-source monitor adjusts wavelength control signals to the optical sources based on the measured output power levels of the optical signals.

Figure 1:
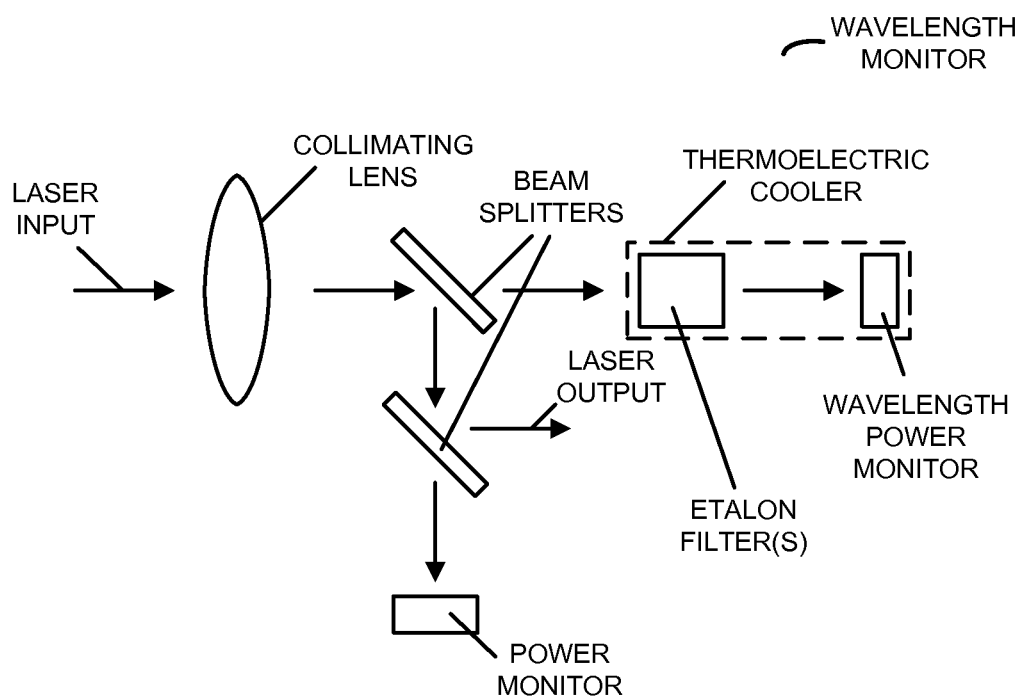
FIG. 1 is a block diagram illustrating an existing wavelength monitor.

Table 1 provides design parameters for an echelle grating in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Embodiments of an optical-source monitor, a system that includes the optical-source monitor, and a method for monitoring carrier wavelengths of optical signals output by optical sources are described. This optical-source monitor images and diffracts received optical signals using an optical device that has a reflective geometry. For example, the optical device may include a diffraction grating on a curved surface, such as an echelle grating. By imaging and diffracting the optical signals, the optical device may couple the optical signals on different diffraction orders of the optical device (which have different carrier wavelengths) from input optical waveguides to corresponding output optical waveguides. Then, output power monitors may measure the output power levels of the optical signals, and control logic may provide wavelength control signals to optical sources that provide the optical signals based on measured output power levels.

By providing monitoring and feedback to the optical sources, the optical-source monitor may facilitate an adjustment of the carrier wavelengths output by the optical sources and, thus, locking of the carrier wavelengths. Furthermore, the optical-source monitor may be compact and monolithically integrated with other components in an optical system (such as an optical link that uses wavelength division multiplexing) that includes the optical sources, thereby ensuring that components in the optical-source monitor are aligned. For example, the optical-source monitor may be implemented on a substrate using silicon-on-insulator technology. In this way, the optical-source monitor may have a reduced size and reduced cost relative to existing wavelength monitors, which may facilitate its use in size-sensitive applications, such as optical links.

Figure 2:
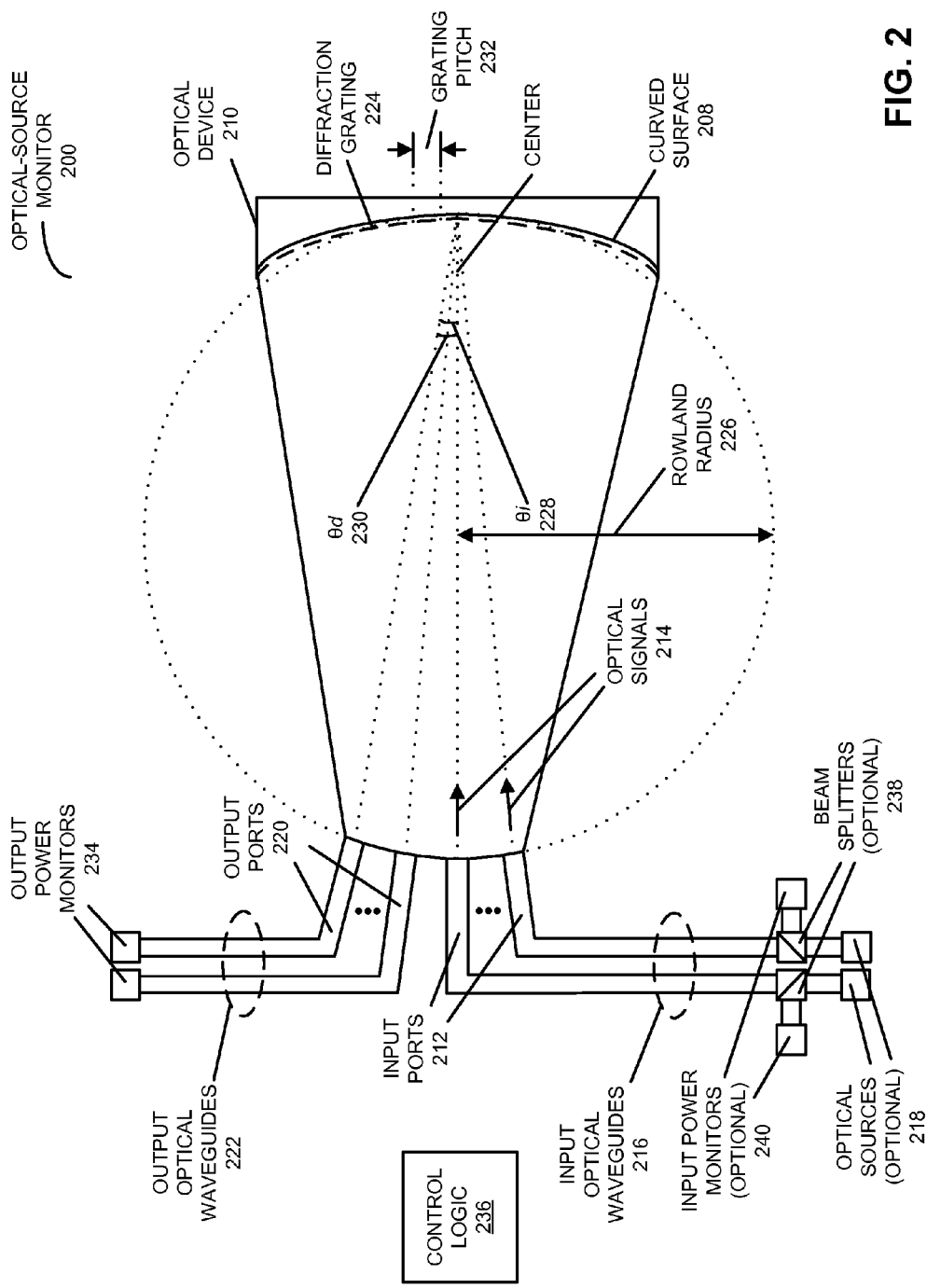
FIG. 2 is a block diagram illustrating a top view of an optical-source monitor in accordance with an embodiment of the present disclosure.

We now describe embodiments of the optical-source monitor. FIG. 2 presents a block diagram illustrating a top view of optical-source monitor 200. This optical-source monitor includes an optical device 210 that has input ports 212 that receive optical signals 214 having carrier wavelengths. For example, optical signals 214 may be received via input optical waveguides 216, and a given optical signal on a given input optical waveguide may have a given carrier wavelength. Furthermore, the carrier wavelengths of optical signals 214 may have a predefined or fixed spacing (such as those used in wavelength division multiplexing or WDM). These optical signals may be output by optional optical sources 218 (e.g., for N optical signals 214, there may be N optional optical sources 218). However, in other embodiments optional optical sources 218 are external to optical-source monitor 200 (i.e., optional optical sources 218 may not be integrated in optical-source monitor 200).

Optical device 210 may image and diffract optical signals 214 using a reflective geometry. In the process, optical signals 214 may be coupled on different diffraction orders of optical device 210 to output ports 220, and then to output optical waveguides 222 (where a given optical signal on a given output optical waveguide may have the given carrier wavelength). Thus, optical device 210 may constitute a wavelength filter that selectively couples carrier wavelengths between input ports 212 and output ports 220.

For example, optical device 210 may include a diffraction grating 224 on a curved surface 208 having a radius of twice Rowland radius 226, such as an echelle grating. Thus, an incidence angle ($\theta_i$) 228 associated with the given diffraction order may be different than a diffraction angle ($\theta_d$) 230 associated with the given diffraction order. Note that grating pitch 232 of diffraction grating 224 may be greater than or equal to 20 μm and/or Rowland radius 226 may be less than 1 mm.

Moreover, output power monitors 234 (such as photo-diode detector arrays), which are optically coupled to output optical waveguides 222, may measure output power levels of optical signals 214, where a given output power monitor may measure an output power level of the given optical signal.

Additionally, control logic 236, which is electrically coupled to output power monitors 234, may provide wavelength control signals to optional optical sources 218 based on the measured output power levels of optical signals 214. For example, if the measured output power level of one of optical signals 214 drops, and the corresponding reading from one of output power monitors 234 is smaller than its maximum value, then control logic 236 may instruct (via one of the wavelength control signals) one of optional optical sources 218 to adjust the carrier wavelength in the optical signal that it outputs. Note that control logic 236 may independently and/or concurrently adjust the wavelength control signals based on the measured output power levels (i.e., control logic 236 may be able to adjust the carrier wavelengths independently and/or concurrently). In this way, optical-source monitor 200 may be used to adjust or lock the carrier wavelengths of optical signals 214.

Note that a number of input optical waveguides 216 may equal a number of output optical waveguides 222, and the number of input optical waveguides 216 may equal a number of carrier wavelengths.

In some embodiments, optical-source monitor 200 is also used to adjust the power levels of optional optical sources 218. For example, optical-source monitor 200 may include: optional beam splitters 238 optically coupled to input optical waveguides 216; and optional input power monitors 240 optically coupled to optional beam splitters 238, where a given input power monitor measures an input power level of the given optical signal. Furthermore, control logic 236 may be electrically coupled to optional input power monitors 240, and may provide power control signals to optional optical sources 218 based on measured input power levels of optical signals 214.

In an exemplary embodiment, a wavelength monitor is based on a diffractive echelle grating with integrated photo-detector arrays to provide multi-wavelength monitoring of WDM light sources. This design may employ carrier wavelengths generated by the comb-filter function from the echelle grating as the wavelength standard. By pairing the multiple inputs to corresponding output wavelengths of the filter, each input carrier wavelength may only be directed to designated output channels. With an optical-waveguide photo-detector integrated at the end of the output channel, variations or drift in the carrier wavelength from a light source can be detected.

When operated without active cooling, this wavelength monitor can be used to dynamically monitor the carrier wavelengths (output by multiple optical sources, such as laser sources) with fixed channel spacing, even though the absolute carrier-wavelength positions may shift due to thermal issues or fabrication variation. In this case, the laser sources, and the associated optical modulators that encode data on the carrier wavelengths, can be tuned together to align to the wavelength spectrum from the echelle grating.

For applications where the operating carrier wavelengths need to be locked (for example to an International Telecommunications Union grid), a thermoelectric cooler (TEC) may be used to control the absolute wavelength of the echelle grating. In this case, using thermal tuning the channel carrier wavelengths can be moved or adjusted together to target carrier wavelengths, but the wavelength gap (or channel spacing) between two adjacent channels may remain the same during the tuning process. The resulting calibrated wavelength monitor can then be used as a wavelength reference to provide feedback to the light sources and optical modulators.

This wavelength-monitor design may be based on optical-waveguides. Therefore, the discrete components in a conventional wavelength locker may be replaced by integrated photo-detectors and optical-waveguide beam taps. When implemented with tunable laser sources (such as WDM light sources), the disclosed optical-source monitor may enable a significant reduction in the size and the cost of the overall package.

We now describe echelle gratings and the optical-source monitor in more detail. Echelle gratings are widely used for telecommunications applications in silicon-on-insulator (SOI) substrates as wavelength multiplexing or de-multiplexing components. Typically, an echelle grating optical de-multiplexer is based on the widely known Rowland circle construction, in which a multi-wavelength light signal is incident from an input optical waveguide, and then propagates and is reflected back by the diffraction grating. Because of the curvature of the diffraction grating, the reflected beams converge and are refocused onto a row of output optical waveguides. Depending on the different input wavelengths, the separated beam can be directed to the corresponding output optical-waveguide channels.

Because of this wavelength-discriminating mechanism, one of the properties of an echelle grating is that it can provide very accurate channel-spacing control of the output spectrum. In particular, in the echelle grating, the different wavelengths propagate through the same silicon slab region, share the same diffraction grating, and hence experience the same manufacturing or ambient variations. As a consequence, deviations or changes in the wavelength gap or spacing between two adjacent channels may be very small. In principle, the channel-spacing variation is only related to the operating wavelength and the material properties by $$\frac{\partial \Delta \lambda}{\Delta \lambda} = \frac{\partial \lambda}{\lambda} + \frac{\partial n_{\text{eff}}}{n_{\text{eff}}} \quad (1)$$

where $\Delta\lambda$ is the channel spacing, $\lambda$ is the operating wavelength, $n_{\text{eff}}$ is the effective optical index of refraction of the silicon slab, $\partial\Delta\lambda$ is the variation in the channel spacing, $\partial\lambda$ is the variation in the operating wavelength, and $\partial n_{\text{eff}}$ is the variation in the effective optical index of refraction of the silicon slab. Note that the center wavelength and the slab optical index of reflection may vary by a few percent (typically, less than 3%) because of changes in silicon-slab thickness. While this means that the center channel wavelengths or carrier wavelengths can vary by up to tens of nanometers, the variation in the channel spacing may be extremely small (e.g., in the tens of picometers) because the channel spacing is typically only 0.8 or 1.6 nm.

An echelle wavelength monitor utilizes this feature to build a fixed-spacing comb filter, which can enable precise control of laser-wavelength spacings in a high-capacity, dense WDM system. In contrast with a conventional optical de-multiplexer, an echelle wavelength monitor may have the same channel counts for both input and output. As shown in FIG. 2, for an optical light signal with N different channels, there are a total of 2N optical waveguides in the echelle grating wavelength-monitor structure. Each carrier wavelength is injected through its own optical waveguide and, by design, at the exit of the slab it may be diffracted into a designated output optical waveguide. A deviation in the carrier wavelength ($\partial\lambda$) in any channel produces a change in optical transmission $\partial T$. Using germanium photo-detectors integrated at the end of the output optical waveguides, the selectively transmitted channel signals can be detected by the photo-detectors, which produce output currents that are mapped to the corresponding carrier wavelengths. Therefore, this design can provide in-situ carrier-wavelength control for the tunable light sources by converting the carrier-wavelength drift into current variations of the photo-detectors. Furthermore, because there is only one matching output for a single input carrier wavelength, and because there is no other input carrier wavelength that will be diffracted into that specific output, all of the N optical channels can be monitored independently and simultaneously.

Figure 3:
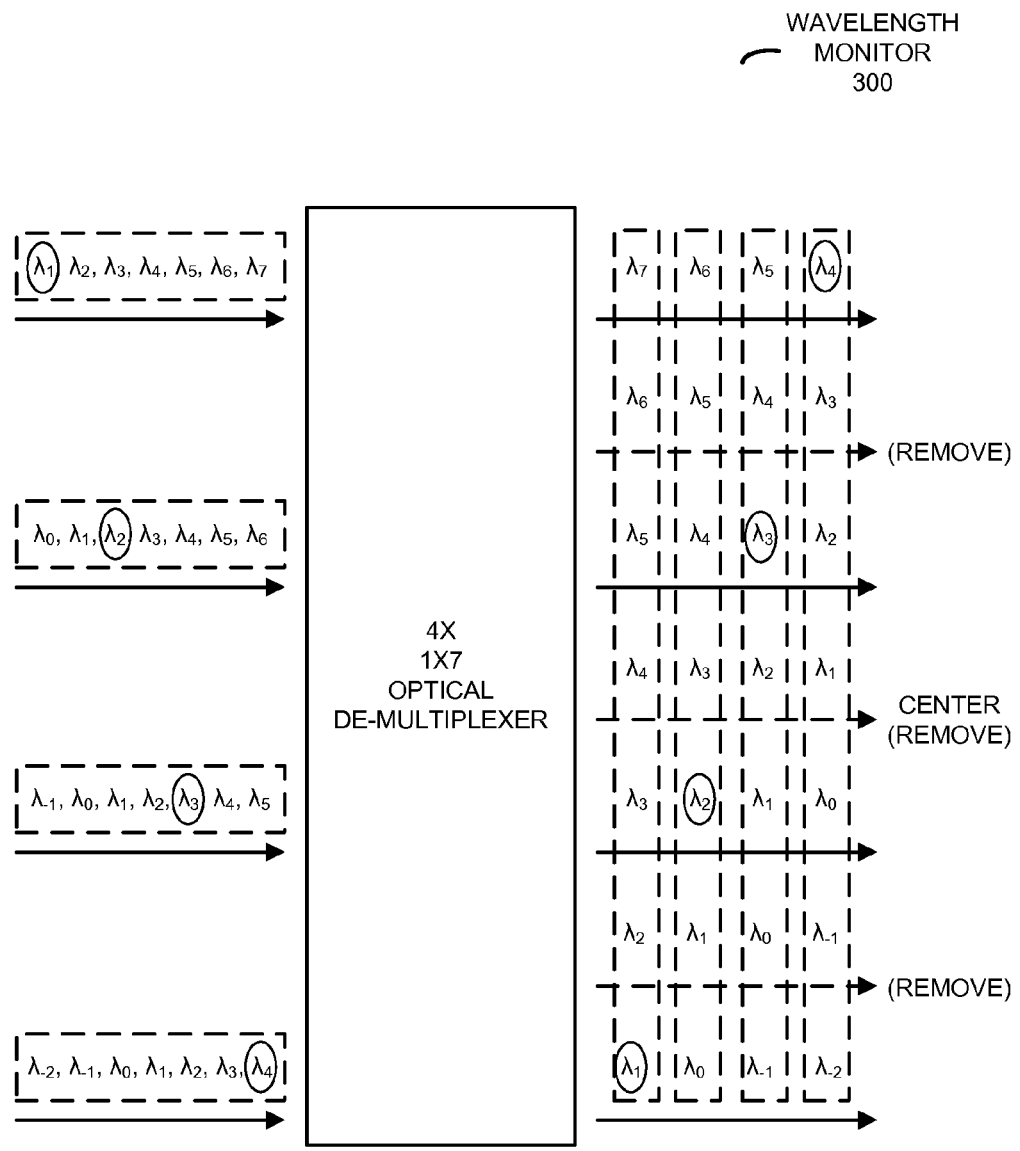
FIG. 3 is a block diagram illustrating a wavelength monitor in accordance with an embodiment of the present disclosure.

An N-channel wavelength monitor based on echelle grating can be designed using N 1-by-(2N-1) optical de-multiplexers, and then merging the overlapping inputs and outputs of these N optical de-multiplexers while eliminating the vacant outputs. FIG. 3 presents a block diagram illustrating a 4-channel wavelength monitor 300. In this wavelength monitor, four optical de-multiplexers share the same echelle-grating structure, i.e., the same grating period (d), Rowland circle radius (R) and material properties. In order for these multiple optical de-multiplexers to function together, they may be designed to have identical linear dispersion (LD). This may ensure that the same wavelength spacing in the different optical de-multiplexers corresponds to the same optical-waveguide spacing. Note that $$LD = 2R \cdot \frac{m}{d\cos\theta_d} \cdot \frac{n_g}{n_{\text{eff}}^2} \quad (2)$$

where m is the diffraction order, $n_g$ is the group index of silicon slab, and $\theta_d$ is the diffraction angle of the center wavelength. On the other hand, all the input and output angles need to obey the diffraction rule of an echelle grating $$d \cdot (\sin\theta_i + \sin\theta_d) = m \cdot \frac{\lambda}{n_{\mathit{eff}}} \quad (3)$$

where $\theta_i$ is the incident angle. In this example, each of the four optical de-multiplexers needs to have a different input optical waveguide, corresponding to a different $\theta_i$, and the four optical de-multiplexers must satisfy Eqns. 2 and 3 at the same time. A solution for this challenge is to use a fixed $\theta_d$ for all four of the optical de-multiplexers (i.e., the center wavelengths of all the input optical waveguides may be diffracted into the same output optical waveguide), which satisfies Eqn. 2, while varying the target center wavelength with a different $\theta_i$ for the four optical de-multiplexers, which satisfies Eqn. 3.

In FIG. 3 the input optical waveguides are on the left-hand side and the output optical waveguides are on the right-hand side. Moreover, each of the columns of carrier wavelengths on the right-hand side (which are enclosed by the dashed boxes) is provided by a corresponding one of the input optical waveguides.

As shown in FIG. 3, the center carrier wavelengths of the four input optical waveguides are designed as $\lambda_1$ to $\lambda_4$. These center carrier wavelengths are diffracted into the same center output optical waveguide (as indicated by 'CENTER' on the right-hand side). The side carrier wavelengths in each of the input optical waveguides are diffracted into side optical waveguides. Because the LD in Eqn. 2 is the same for the four optical de-multiplexers, when the channel spacings are the same for these four groups of inputs, the output optical waveguides for the side carrier wavelengths are also at the same positions. This creates four 1×7 optical de-multiplexers with different input optical waveguides but the same output optical waveguides (although their center working wavelengths are different). During operation, a single carrier wavelength (i.e., a side carrier wavelength) is input into each input optical waveguide (i.e., $\lambda_4$ to $\lambda_1$). Therefore, only four output optical waveguides receive optical signals; the other three optical waveguides will be vacant and can be removed from the design (as indicated in FIG. 3). (Alternatively, wavelength filters may be used to select the appropriate carrier wavelengths from the output optical waveguides.) When any input carrier wavelength deviates from the target carrier wavelength, the optical power in the corresponding output optical waveguide will decrease, which can be detected by the integrated photo-detector, whose signal can be sent to the control circuit. This creates a wavelength monitor that monitors multiple channels simultaneously.

Figure 4:
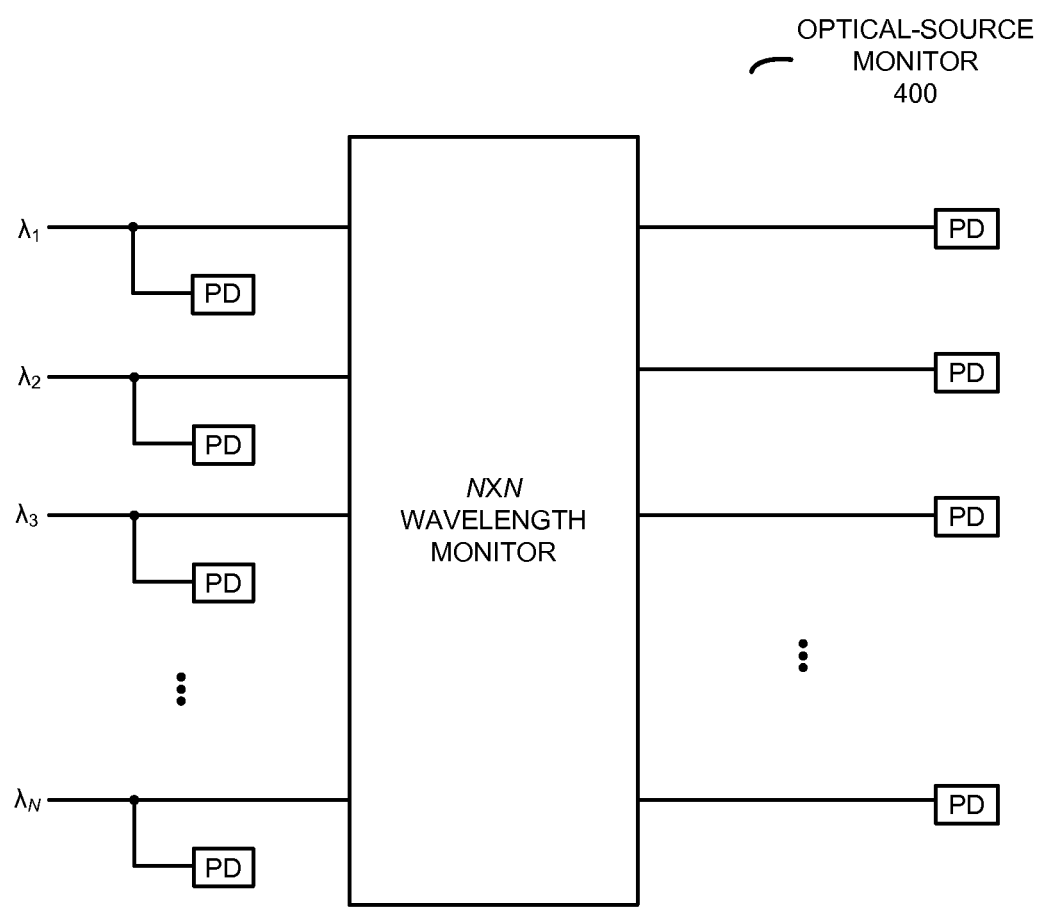
FIG. 4 is a block diagram illustrating an optical-source monitor in accordance with an embodiment of the present disclosure.

In general, a wavelength locker for a tunable light source provides both wavelength monitoring and power monitoring. A compact monolithically integrated optical-source monitor 400 with wavelength and power monitoring is shown in FIG. 4, with N input optical waveguides and N output optical waveguides (for example, N may be 16). Two groups of germanium photo-detectors (PDs) are used to provide feedback signals for both laser intensity and lasing wavelength. The power-monitoring photo-diodes are implemented before the echelle grating. A very small amount of laser power may be tapped off by the optical-waveguide taps onto these photo-detectors to monitor the laser power. Another group of photo-diodes are placed after the echelle grating, forming a wavelength monitor in which the wavelength information is detected and fed back to the light sources.

Figure 5:
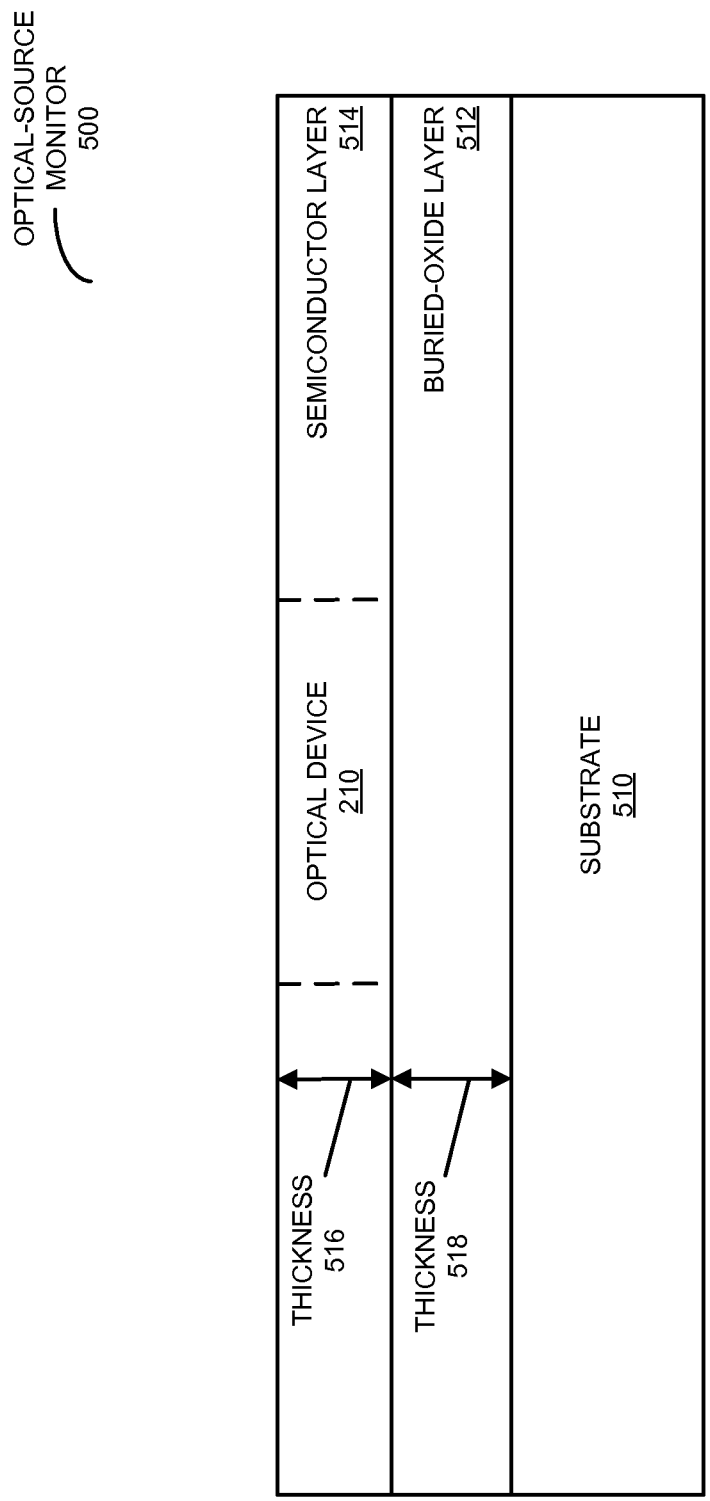
FIG. 5 is a block diagram illustrating a side view of an optical-source monitor in accordance with an embodiment of the present disclosure.

As noted previously, the optical-source monitor may be implemented using SOI technology. This is illustrated in FIG. 5, which presents a block diagram illustrating a side view of an optical-source monitor 500. In particular, optical-source monitor 500 may include: a substrate 510; a buried-oxide layer 512 disposed on substrate 510; and a semiconductor layer 514 disposed on buried-oxide layer 512, where at least optical device 210 is included in semiconductor layer 514. For example, substrate 510 and/or semiconductor layer 514 may include a semiconductor, such as silicon.

In an exemplary embodiment, optical signals 214 (FIG. 2) have wavelengths between 1.1-1.7 μm, such as an optical signal having a fundamental wavelength of 1.3 or 1.55 μm. Moreover, semiconductor layer 514 may have a thickness 516 that is less than 1 μm (such as 0.25-0.3 μm). Furthermore, buried-oxide layer 512 may have a thickness 518 between 0.3 and 3 μm (such as 0.8 μm).

The parameters for an exemplary design of an echelle grating are provided in Table 1.

TABLE 1

| | |
|---|---|
| Channel count | 8 |
| Channel spacing (nm) | 1.6 |
| Optical crosstalk (dB) | 20-25 |
| Footprint (μm²) | 500 × 200 |
| Insertion loss | <3 dB |
| Carrier wavelength (nm) | 1550 |
| FSR (nm) | 12.8 |
| Thickness 516 (nm) | 300 |
| Diffraction order | 90 |
| Grating pitch (μm) | 25 |

Thus, a monolithically integrated waveguide based multi-channel optical-source monitor based on echelle grating has been disclosed. This optical device may allow in-situ wavelength monitoring of multiple wavelengths simultaneously with high precision. When integrated with photo-detectors (such as germanium photo-detectors) and tunable multi-channel laser sources, it can be used to prevent laser wavelengths from drifting into adjacent channels and causing signal degradation. The integrated optical-source monitor can have a wide locking range capability and 2.5-5 GHz wavelength accuracy. If the echelle grating is designed to have a cyclic free spectral range (to provide a continuous comb transmission), it will also allow the tunable laser source(s) to stabilize any channel on the International Telecommunication Unit wavelength grid with very small thermal tuning Furthermore, this optical waveguide based wavelength monitor can be monolithically integrated with germanium power photo-detectors, beam taps, and even the light sources, which will significantly simplify the packaging process by avoiding alignment issues between discrete components. In summary, with the functional integration of beam splitting, wavelength discrimination and photo-detection in a single optical device, the optical-source monitor can potentially replace the traditional approach to wavelength locking by providing reduced overall packaging cost, complexity and size.

Figure 6:
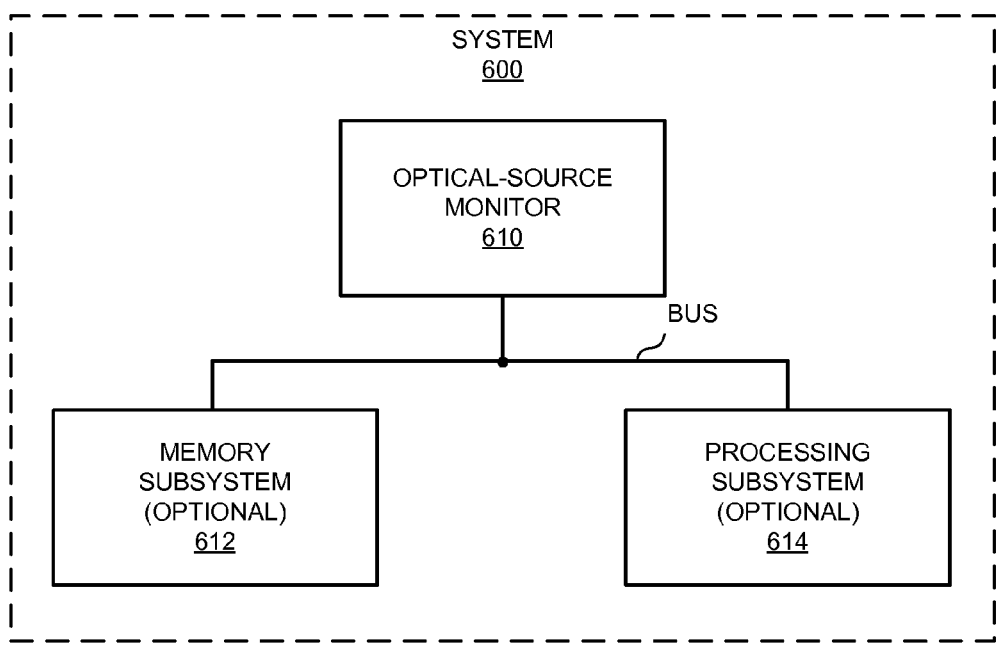
FIG. 6 is a block diagram illustrating a system that includes an optical-source monitor in accordance with an embodiment of the present disclosure.

The optical-source monitor may be used in a variety of applications. This is shown in FIG. 6, which presents a block diagram illustrating a system 600 that includes an optical-source monitor 610, such as one of the preceding embodiments of the optical-source monitor.

System 600 may include: a VLSI circuit, a switch, a hub, a bridge, a router, a communication system, a storage area network, a data center, a network (such as a local area network), and/or a computer system (such as a multiple-core processor computer system). Furthermore, the computer system may include, but is not limited to: a server (such as a multi-socket, multi-rack server), a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, and/or another electronic computing device. Note that a given computer system may be at one location or may be distributed over multiple, geographically dispersed locations.

Moreover, the optical-source monitor, as well as system 600, may include fewer components or additional components. Although these embodiments are illustrated as having a number of discrete items, these optical components, integrated circuits and the system are intended to be functional descriptions of the various features that may be present rather than structural schematics of the embodiments described herein. Consequently, in these embodiments two or more components may be combined into a single component, and/or a position of one or more components may be changed.

In addition, functionality in the preceding embodiments of the integrated circuits and the system may be implemented more in hardware and less in software, or less in hardware and more in software, as is known in the art. For example, functionality may be implemented in one or more application-specific integrated circuits (ASICs) and/or one or more digital signal processors (DSPs). As shown in FIG. 6, system 600 may include one or more program modules or sets of instructions stored in an optional memory subsystem 612 (such as DRAM or another type of volatile or non-volatile computer-readable memory), which may be executed by an optional processing subsystem 614. Note that the one or more computer programs may constitute a computer-program mechanism. Furthermore, instructions in the various modules in optional memory subsystem 612 may be implemented in: a high-level procedural language, an object-oriented programming language, and/or in an assembly or machine language. Note that the programming language may be compiled or interpreted, e.g., configurable or configured, to be executed by optional processing subsystem 614.

Figure 7:
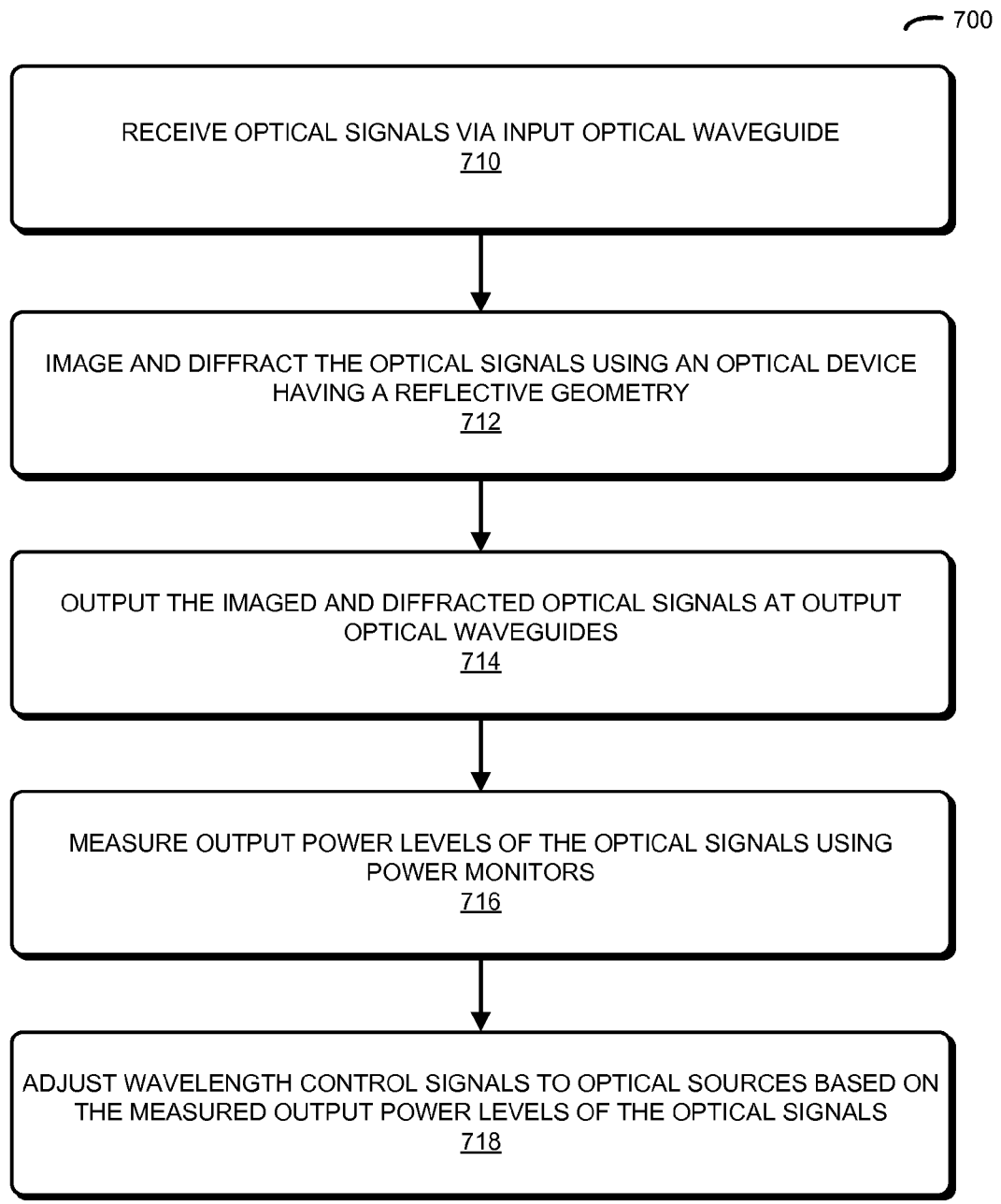
FIG. 7 is a flow chart illustrating a method for monitoring carrier wavelengths of optical signals output by optical sources in accordance with an embodiment of the present disclosure.

We now describe embodiments of the method. FIG. 7 presents a flow chart illustrating a method 700 for monitoring carrier wavelengths of optical signals output by optical sources, which may be implemented using an optical-source monitor (such as one of the preceding embodiments of the optical-source monitor). During operation, the optical-source monitor receives the optical signal via the input optical waveguides (operation 710), where the given optical signal on the given input optical waveguide has the given carrier wavelength. Then, the optical device having the reflective geometry images and diffracts the optical signals (operation 712). Moreover, the optical device outputs the optical signals on different diffraction orders of the optical device at the output optical waveguides (operation 714), where the given optical signal on the given output optical waveguide has the given carrier wavelength. Furthermore, the power monitors measure the output power levels of the optical signals (operation 716), where the given output power monitor measures the output power level of the given optical signal. Next, the optical-source monitor adjusts wavelength control signals to the optical sources based on the measured output power levels of the optical signals (operation 718).

In some embodiments of method 700 there are additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An optical-source monitor, comprising:
an optical device, input optical waveguides, output optical waveguides, output power monitors, and control logic,
the input optical waveguides configured to convey optical signals having carrier wavelengths, wherein each of the input optical waveguides is configured to convey a plurality of carrier wavelengths simultaneously, and wherein each of the input optical waveguides is arranged to have a different incident angle so that center carrier wavelengths of all the input optical waveguides are diffracted into a same output optical waveguide, wherein corresponding side carrier wavelengths of all the input optical waveguides are diffracted into respective output optical waveguides,
wherein the optical device comprises a plurality of input ports, a plurality of output ports, and a reflective geometry, each of the input ports optically coupled to a corresponding input optical waveguide and configured to receive the optical signal for the corresponding input optical waveguide,
wherein, for each optical signal of the optical signals, the optical device images and diffracts the optical signal from the corresponding input port using the reflective geometry, and wherein, after imaging and diffracting the optical signal, the optical device optically couples the optical signal to a corresponding output port in the output ports on a different diffraction order of the optical device,
wherein each of the output ports is optically coupled to a corresponding output optical waveguide of the output optical waveguides, and wherein each of the output ports is configured to couple the corresponding optical signal to the output optical waveguide for the output port,
wherein the output optical waveguides are configured to convey the optical signals, wherein each of the output optical waveguides is configured to receive one carrier wavelength from each of the input optical waveguides.

2. The optical-source monitor of claim 1, wherein an incidence angle associated with the diffraction order is different than a diffraction angle associated with the diffraction order.

3. The optical-source monitor of claim 1, wherein the reflective geometry includes a diffraction grating on a curved surface.

4. The optical-source monitor of claim 1, wherein the reflective geometry includes an echelle grating.

5. The optical-source monitor of claim 1, further comprising:
   a substrate;
   a buried-oxide layer disposed on the substrate; and
   a semiconductor layer disposed on the buried-oxide layer, wherein the optical device is included in the semiconductor layer.

6. The optical-source monitor of claim 5, wherein the substrate, the buried-oxide layer and the semiconductor layer comprise a silicon-on-insulator technology.

7. The optical-source monitor of claim 1, wherein the carrier wavelengths have a fixed spacing.

8. The optical-source monitor of claim 1, wherein a number of input optical waveguides equals a number of output optical waveguides; and
   wherein the number of input optical waveguides equals a number of carrier wavelengths.

9. The optical-source monitor of claim 1, wherein the output power monitors are optically coupled to the output optical waveguides and are configured to measure output power levels of the optical signals, wherein a given output power monitor is configured to measure an output power level of the given optical signal, and
   wherein the control logic is electrically coupled to the output power monitors and is configured to provide wavelength control signals to optical sources that provide the optical signals based on the measured output power levels of the optical signals.

10. The optical-source monitor of claim 1, further comprising:
    beam splitters optically coupled to the input optical waveguides; and
    input power monitors optically coupled to the beam splitters, wherein a given input power monitor is configured to measure an input power level of the given optical signal; and
    wherein the control logic is electrically coupled to the input power monitors and is configured to provide power control signals to the optical sources that provide the optical signals based on measured input power levels of the optical signals.

11. A system, comprising:
    a processor;
    a memory storing a program module that is configured to be executed by the processor;
    optical sources configured to output optical signals having carrier wavelengths, wherein a given optical signal output by a given optical source has a given carrier wavelength; and
    an optical-source monitor, wherein the optical-source monitor which includes an optical device, input optical waveguides, output optical waveguides, output power monitors, and control logic,
    the input optical waveguides configured to convey the optical signals, wherein each of the input optical waveguides is configured to convey a plurality of carrier wavelengths simultaneously, and wherein each of the input optical waveguides is arranged to have a different incident angle so that center carrier wavelengths of all the input optical waveguides are diffracted into a same output optical waveguide, wherein corresponding side carrier wavelengths of all the input optical waveguides are diffracted into respective output optical waveguides,
    wherein the optical device comprises a plurality of input ports, a plurality of output ports, and a reflective geometry, wherein each of the input ports is optically coupled to a corresponding input optical waveguide and is configured to receive the optical signal for the corresponding input optical waveguide,
    wherein, for each optical signal of the optical signals, the optical device images and diffracts the optical signal from the corresponding input port using the reflective geometry, and wherein, after imaging and diffracting the optical signal, the optical device optically couples the optical signal to a corresponding output port in the output ports on a different diffraction order or the optical device,
    wherein each of the output ports is optically coupled to a corresponding output optical waveguide of the output optical waveguides, and wherein each of the output ports is configured to couple the corresponding optical signal to the output optical waveguide for the output port,
    wherein the output optical waveguides are configured to convey the optical signals, wherein each of the output optical waveguides is configured to receive one carrier wavelength from each of the input optical waveguides.

12. The system of claim 11, wherein an incidence angle associated with the given diffraction order is different than a diffraction angle associated with the given diffraction order.

13. The system of claim 11, wherein the optical device includes a diffraction grating on a curved surface.

14. The system of claim 11, wherein the optical device includes an echelle grating.

15. The system of claim 11, further comprising:
    a substrate;
    a buried-oxide layer disposed on the substrate; and
    a semiconductor layer is disposed on the buried-oxide layer, wherein the optical device is included in the semiconductor layer.

16. The system of claim 11, wherein a number of input optical waveguides equals a number of output optical waveguides; and
    wherein the number of input optical waveguides equals a number of carrier wavelengths.

17. The system of claim 11, wherein the output power monitors are optically coupled to the output optical waveguides are configured to measure output power levels of the optical signals, wherein a given output power monitor is configured to measure an output power level of the given optical signal, and
    wherein the control logic is electrically coupled to the output power monitors and is configured configured to provide wavelength control signals to the optical sources based on the measured output power levels of the optical signals.

18. The system of claim 11, wherein the optical-source monitor further comprises:
    beam splitters optically coupled to the input optical waveguides; and
    input power monitors optically coupled to the beam splitters, wherein a given input power monitor is configured to measure an input power level of the given optical signal;
    wherein the control logic is electrically coupled to the input power monitors and the optical sources; and
    wherein the control logic is configured to provide power control signals to the optical sources based on measured input power levels of the optical signals.

19. A method for monitoring carrier wavelengths of optical signals output by optical sources, wherein the method comprises:
    receiving the optical signal via input optical waveguides, wherein each of the input optical waveguides is configured to convey a plurality of carrier wavelengths simultaneously, and wherein each of the input optical waveguides is arranged to have a different incident angle so that center carrier wavelengths of all the input optical waveguides are diffracted into a same output optical waveguide, wherein corresponding side carrier wavelengths of all the input optical waveguides are diffracted into respective output optical waveguides;

imaging and diffracting the optical signals using an optical device having a reflective geometry, wherein the optical device comprises a plurality of input ports and a plurality of output ports, wherein each of the input ports is optically coupled to a corresponding input optical waveguide and is configured to receive the optical signal for the corresponding input optical waveguide, and wherein imaging and diffracting the optical signals comprises, for each optical signal of the optical signals:

imaging and diffracting the optical signal from the corresponding input port using the reflective geometry, and after imaging and diffracting the optical signal, outputting the optical signal to a corresponding output port in the output ports on a different diffraction order to the optical device;

measuring output power levels of the optical signals using power monitors, wherein a given output power monitor measures an output power level of the given optical signal; and adjusting wavelength control signals to the optical sources based on measured output power levels of the optical signals, wherein each of the output ports is optically coupled to a corresponding output optical waveguide, and wherein each of the output optical waveguides is configured to receive one carrier wavelength from each of the input optical waveguide.

20. The optical-source monitor of claim 1, wherein, for each optical signal of the optical signals, the optical device images and diffracts the optical signal from the corresponding input optical waveguide concurrently with other optical signals using the same reflective geometry, and wherein the diffraction order for the optical signal is different from the diffraction orders for other optical signals.

* * * * *